United States Patent [19]

Hotta

[11] Patent Number: 5,331,594

[45] Date of Patent: Jul. 19, 1994

[54] SEMICONDUCTOR MEMORY DEVICE HAVING WORD LINE AND BIT LINE TEST CIRCUITS

[75] Inventor: Yasuhiro Hotta, Nara, Japan

[73] Assignee: Sharp Kabushiki Kaisha, Osaka, Japan

[21] Appl. No.: 776,052

[22] Filed: Oct. 10, 1991

[30] Foreign Application Priority Data

Oct. 11, 1990 [JP] Japan .................................. 2-274803

[51] Int. Cl.⁵ ...................... H01L 21/00; G11C 29/00
[52] U.S. Cl. .................................... 365/201; 365/200; 365/230.06
[58] Field of Search .................. 365/201, 200, 230.06, 365/189.03

[56] References Cited

U.S. PATENT DOCUMENTS

| | | |
|---|---|---|
| 4,393,475 | 7/1983 | Kitagawa et al. ................... 365/201 |
| 4,464,750 | 8/1984 | Tatematsu .......................... 365/201 |
| 4,685,086 | 8/1987 | Tran ................................. 365/203 |
| 4,779,272 | 10/1988 | Kohda et al. ........................ 365/201 |
| 4,896,322 | 1/1990 | Kraus et al. .......................... 365/201 |
| 4,920,515 | 4/1990 | Obata . | |
| 4,956,819 | 9/1990 | Hoffmann et al. ................... 365/201 |

FOREIGN PATENT DOCUMENTS

| | | |
|---|---|---|
| 167788 | 9/1991 | China . |
| 0223188 | 5/1987 | European Pat. Off. . |
| 0410492 | 1/1991 | European Pat. Off. . |
| 0450632 | 10/1991 | European Pat. Off. . |
| 1-243291 | 9/1989 | Japan . |
| 1-276500 | 11/1989 | Japan . |
| 1-296500 | 11/1989 | Japan . |

OTHER PUBLICATIONS

Patent Abstracts of Japan vol. 14, No. 581, (P-1147) Dec. 26, 1990. The corresponding Japanese Patent Publication No. 2-249196 is also enclosed herewith.

Primary Examiner—Viet Q. Nguyen
Attorney, Agent, or Firm—Morrison & Foerster

[57] ABSTRACT

A semiconductor memory device such as a ROM is provided with a word line test circuit and a word line drive circuit. The word line test circuit outputs a high level signal when a test signal is applied and a low level signal when the test signal is not applied. The word line drive circuit drives the respective word lines in the memory cell array, and is connected to the output of the word line test circuit, so that when driving one group of word lines (either the odd-numbered word lines or the even-numbered word lines), a high level signal is applied to the one group of word lines, and when not driving the one group of word lines, a low level signal is applied to the one group of word lines. On the other hand, when driving the other group of word lines, a high level signal is applied to the other group of word lines, and when not driving the other group of word lines, the output signal from the word line test circuit is applied to the other group of word lines, thereby enabling short circuits between adjacent word lines to be identified quickly. A bit line test switch circuit is provided which is connected to the bit lines in the memory cell array. In response to a test signal, the bit line test switch circuit applies signals of different levels to the odd-numbered and even-numbered bit lines respectively, and short circuits between adjacent bit lines can be identified quickly.

9 Claims, 3 Drawing Sheets

SEMICONDUCTOR MEMORY DEVICE HAVING WORD LINE AND BIT LINE TEST CIRCUITS

BACKGROUND OF THE INVENTION

1. Field of the Invention

This invention relates to a semiconductor memory device such as a ROM (Read Only Memory).

2. Description of the Prior Art

Generally, semiconductor memory devices are tested by checking whether the intended data can be obtained for input of a particular address signal, thereby distinguishing between good and bad ones. In recent years, with advances in miniaturization techniques, the memory cell area has been further reduced, which in turn has led to an increase in the failure rate attributed to short circuits between adjacent word lines or between adjacent bit lines within the memory array because of processing effects. In the prior art, verification of such failure has been accomplished by sequentially reading every address location and thus determining the result.

However, such verification methods has the disadvantage of requiring a prolonged test period, which even further increases with the increase of the memory capacity being expanded.

SUMMARY OF THE INVENTION

The semiconductor memory device of this invention, which overcomes the above-discussed and numerous other disadvantages and deficiencies of the prior art, comprises a plurality of word lines which are arranged in parallel, and word line drive means for respectively driving said word lines, and further comprises word line test means for receiving a test signal, and for producing an output signal, the level of said output signal being high when said test signal is active and low when said test signal is not active, preselected ones of said word line drive means being coupled to an output of said test means, and, when the associated word lines are not to be driven, applying said output signal to said associated word lines.

In the semiconductor memory device of the invention, the word line test means outputs a high level signal when a test signal is applied and a low level signal when the test signal is not applied. The word line drive means drives the respective word lines in the memory cell array, and is connected to the output of the word line test means, so that when driving one group of word lines (either the odd-numbered word lines or the even-numbered word lines), a high level signal is applied to the one group of word lines, and when not driving the one group of word lines, a low level signal is applied to the one group of word lines. On the other hand, when driving the other group of word lines, a high level signal is applied to the other group of word lines, and when not driving the other group of word lines, the output signal from the word line test means is applied to the other group of word lines, thereby enabling short circuits between adjacent word lines to be identified in a short period of time.

In another aspect of the invention, a semiconductor memory device comprises a plurality of bit lines which are arranged in parallel, and bit line test means for receiving a test signal, and for, when said test signal is active, applying a first output signal to odd-numbered ones of said bit lines and a second output signal to even-numbered ones of said bit lines, said first and second output signals being different in level from each other.

In a further aspect of the invention, a semiconductor memory device comprises a plurality of word lines which are arranged in parallel, a plurality of bit lines which are arranged in parallel, and word line drive means for respectively driving said word lines, and further comprises: word line test means for receiving a test signal, and for producing an output signal, the level of said output signal being high when said test signal is active and low when said test signal is not active; and bit line test means for receiving a test signal, and for, when said test signal is active, applying a first output signal to odd-numbered ones of said bit lines and a second output signal to even-numbered ones of said bit lines, said first and second output signals being different in level from each other, preselected ones of said word line drive means being coupled to an output of said test means, and, when the associated word lines are not to be driven, applying said output signal to said associated word lines.

In preferred embodiments, said preselected word line drive means are ones connected to odd-numbered word lines.

In preferred embodiments, said preselected word line drive means are ones connected to even-numbered word lines.

In preferred embodiments, said bit line test means comprises switch means for, when said test signal is active, connecting said bit line test means to said bit lines.

Thus, the invention described herein makes possible the objective of providing a semiconductor memory device in which failures attributed to short circuits between adjacent word lines and/or between adjacent bit lines can be identified in a short period of time.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
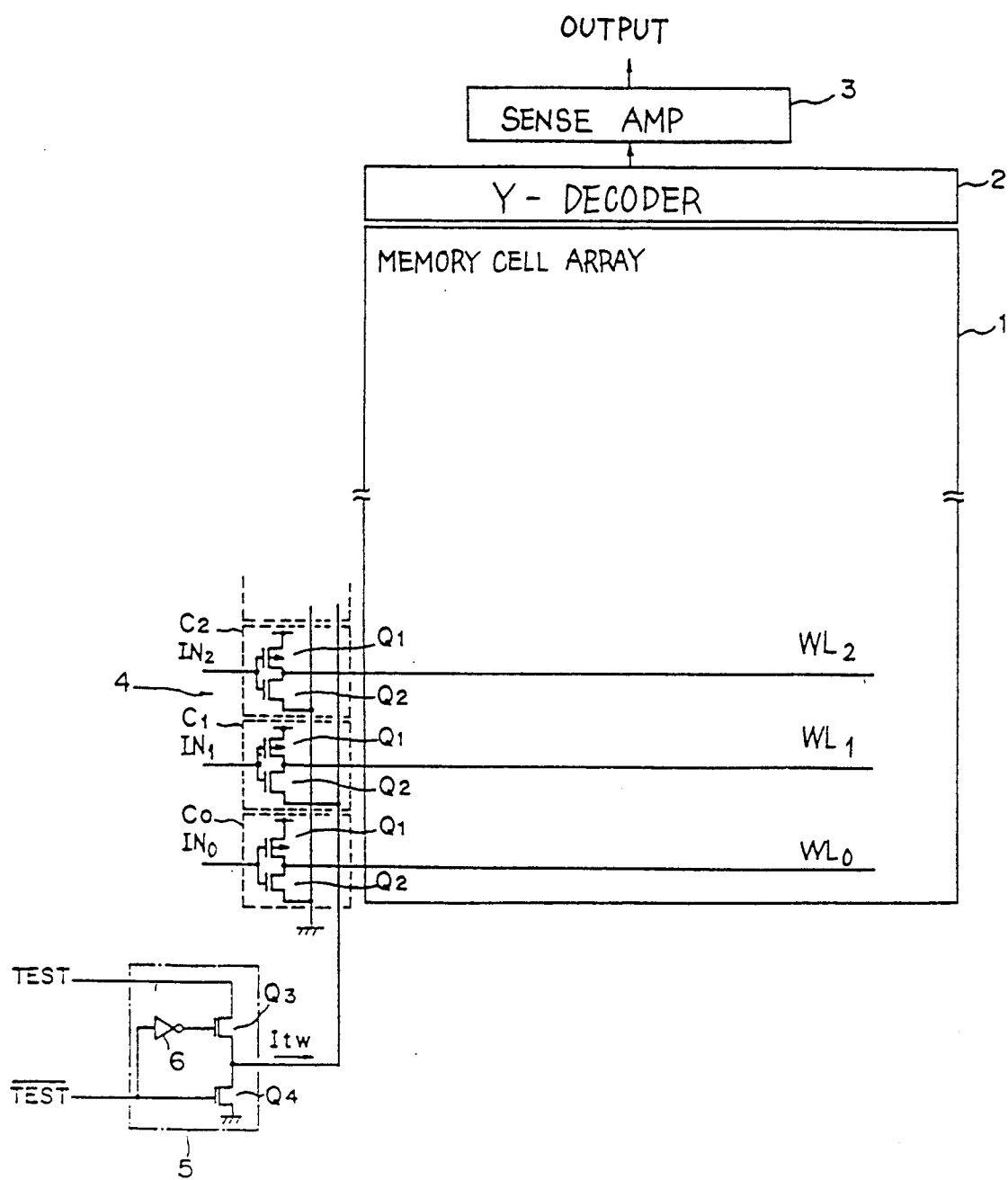
FIG. 1 is a circuit diagram schematically illustrating a first embodiment of the invention.

FIG. 1 shows an embodiment of the invention. This embodiment is a ROM comprising a memory cell array 1, a Y-decoder 2, a sense amplifier 3, a word line driving unit 4, and a word line test switch circuit 5.

The memory cell array i has a large number of memory cells (not shown) which are arranged in a matrix form. Each memory cell is selected when the word line to which the memory cell is connected is driven by the word line driving unit 4. The data stored in the selected memory cell is output on the bit line (not shown in FIG. 1) connected to the memory cell and is transferred through the Y-decoder 2 to the sense amplifier 3.

The word line driving unit 4 consists of driving circuits $C_0$, $C_1$, $C_2$, ... which drive the word lines $WL_0$, $WL_1$, $WL_2$, ..., respectively. Each of the driving circuits has a PMOS transistor $Q_1$ and an NMOS transistor $Q_2$. The source and drain of the PMOS transistor $Q_1$ are respectively connected to the Vcc level and the drain of the NMOS transistor $Q_2$. Each respective one of control signals $IN_0$, $IN_1$, $IN_2$, ... is applied to the gates of the transistors $Q_1$ and $Q_2$. In the even-numbered driving circuits $C_0$, $C_2$, ..., the source of the NMOS transistor $Q_2$ is connected to the ground. By contrast, in the odd-numbered driving circuits $C_1$, $C_3$, ..., the source of the NMOS transistor $Q_2$ is connected to the output of the word line test switch circuit 5. The control signals $IN_0$, $IN_1$, $IN_2$, ... are normally set to the Vcc level, keeping the NMOS transistors $Q_2$ in conduction and therefore holding the respective word lines either at the ground level or at the same level as the output signal of the word line test switch circuit 5. In order to select a particular memory cell, the control signal applied to the driving circuit which drives the word line connected to that memory cell is set low, causing the PMOS transistor $Q_1$ in that driving circuit to conduct and thereby setting the word line to the Vcc level.

The word line test switch circuit 5 comprises NMOS transistors $Q_3$ and $Q_4$ and an inverter 6. The source of the transistor $Q_4$ is connected to the ground, and the source of the NMOS transistor $Q_3$ is connected to the drain of the NMOS transistor $Q_4$. A test signal TEST is applied to the drain of the NMOS transistor $Q_3$. An inverted test signal $\overline{TEST}$ is applied directly to the gate of the NMOS transistor $Q_4$, and to the gate of the NMOS transistor $Q_3$ via the inverter 6. In the test mode, the test signal TEST and inverted test signal $\overline{TEST}$ are set at the Vcc and ground levels respectively. Therefore, a high level signal which is given by subtracting the threshold value Vth of the NMOS transistor $Q_3$ from the Vcc level is output from the circuit 5 in the test mode, while, in non-test mode, a signal of the ground level is output.

When testing the thus constructed semiconductor memory for failures resulting from word line shorting, the test signal TEST is set to the Vcc level while holding all the control signals $IN_0$, $IN_1$, $IN_2$, ... applied to the word line driving circuits $C_0$, $C_1$, $C_2$, ... at the Vcc level. This causes the NMOS transistors $Q_2$ in the driving circuits $C_0$, $C_1$, $C_2$, ... and the NMOS transistor $Q_3$ in the test switch circuit 5 to be conductive. As a result, the even-numbered word lines $WL_0$, $WL_2$, ... are set to the ground level, while on the other hand, the odd-numbered word lines $WL_1$, $WL_3$, ... are driven high since the output signal of the test switch circuit 5 is set high. Because of the thus provided difference between the potential applied to the even-numbered word lines and that applied to the odd-numbered word lines, it is expected that a current Itw will flow through the output of the test switch circuit 5 if there is any short circuit between adjacent word lines. Therefore, by measuring this current, it is possible to check in a short period of time for failures resulting from word line shorting.

Figure 2:
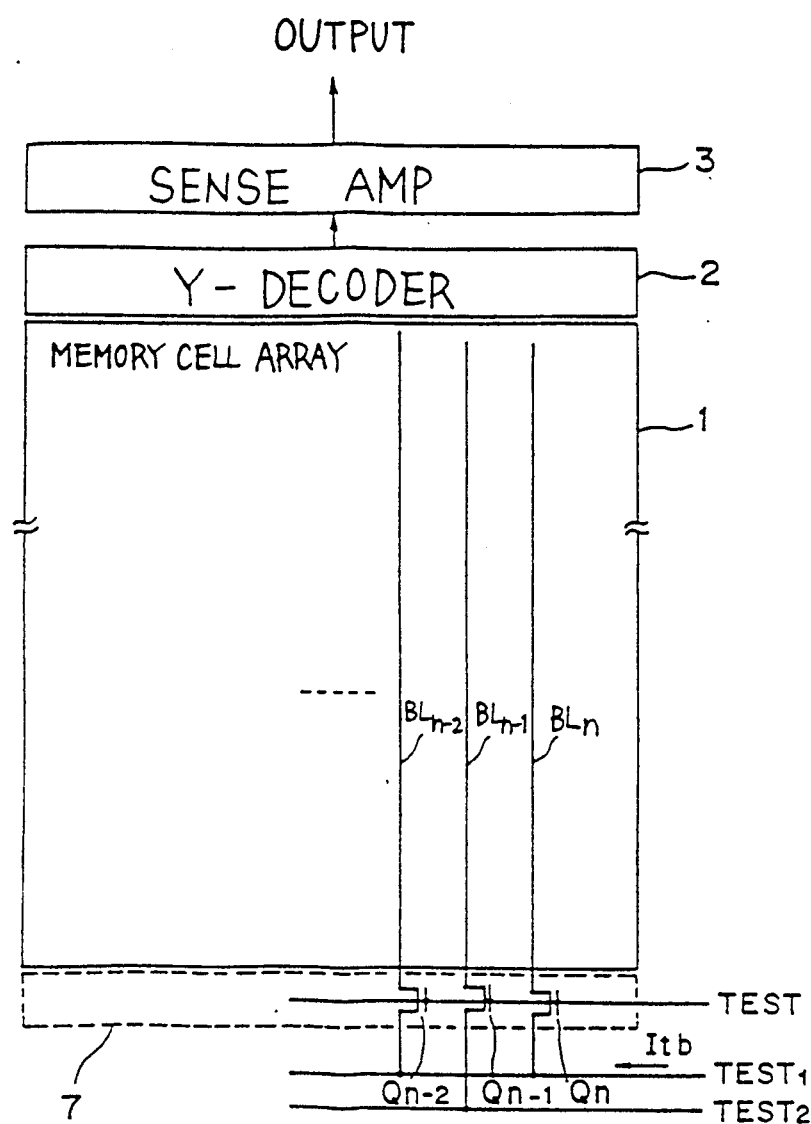
FIG. 2 is a circuit diagram schematically illustrating a second embodiment of the invention.

FIG. 2 shows a second embodiment of the invention. The embodiment of FIG. 2 comprises a memory cell array 1, a Y-decoder 2, and a sense amplifier 3, as in the foregoing embodiment of FIG. 1. For the sake of simplicity, the word lines and the word line driving unit are not shown in FIG. 2. This embodiment further comprises a bit line test switch circuit 7 comprising NMOS transistors $Q_i$ ($i=0$, ..., n). The sources of the NMOS transistors $Q_i$ are connected to the ends of respective bit lines $BL_i$. A test signal TEST is coupled to the gates of the NMOS transistors $Q_i$, a signal $TEST_1$ is coupled to the drains of the transistors connected to the even-numbered bit lines, and a signal $TEST_2$ is coupled to the drains of the transistors connected to the odd-numbered bit lines.

In the test mode, all the word lines are placed in a non-selected state, and the test signal TEST is set to the Vcc level, causing all the NMOS transistors $Q_i$ to be conductive. Under this condition, the signal $TEST_1$ is set to a high level and the signal $TEST_2$ to the ground level, thereby setting the even-numbered bit lines to a high level and the odd-numbered bit lines to the ground level. Therefore, by measuring the current Itb flowing through the signal line for the signal $TEST_1$, it is possible to check for short circuits between adjacent bit lines in a short period of time.

Figure 3:
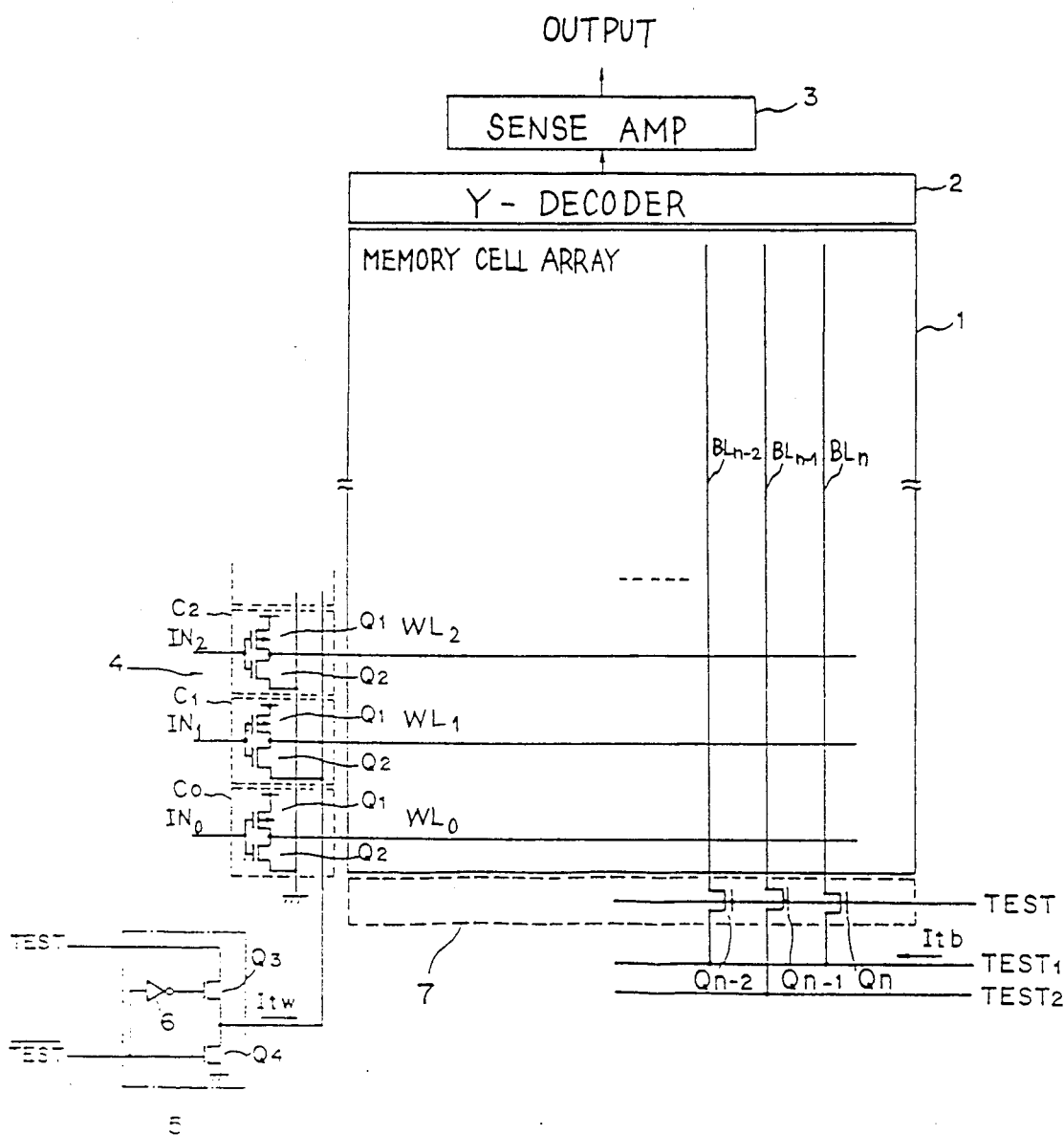
FIG. 3 is a circuit diagram schematically illustrating a third embodiment of the invention.

FIG. 3 shows a third embodiment of the invention. This embodiment is a ROM having the same configuration as that of the ROM of FIG. 1 and provided with the bit line test switch circuit shown in FIG. 2. As apparent from the above description, the configuration of this embodiment permits the testing for shorts not only between adjacent word lines but also between adjacent bit lines. Furthermore, by combining these two test modes, it is also possible to check for defects in contacts of bit lines and memory cell transistors, the gate oxide film of a memory cell transistor, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor memory device comprising a plurality of word lines which are arranged in parallel, and word line drive means for respectively driving said word lines,
    said semiconductor memory device further comprises word line test means for receiving a test signal, and for producing an output signal, the voltage level of said output signal being a first level when said test signal is active and a second level when said test signal is not active,
    preselected ones of said word line drive means being coupled to an output of said test means such that when the preselected word line drive means are not active, said output signal is applied to said preselected word lines.

2. A semiconductor memory device according to claim 1, wherein said preselected word line drive means are ones connected to odd-numbered word lines.

3. A semiconductor memory device according to claim 1, wherein said preselected word line drive means are ones connected to even-numbered word lines.

4. In a semiconductor memory device comprising a plurality of word lines which are arranged in parallel, a plurality of bit lines which are arranged in parallel, and word line drive means for respectively driving said word lines,
    said semiconductor memory device further comprises:
    word line test means for receiving a test signal, and for producing an output signal, the voltage level of said output signal being a first level when said test signal is active and a second level when said test signal is not active, said first and second levels being different from each other; and bit line test means for receiving a test signal, and for, when said test signal is active, applying a third output signal to odd-numbered ones of said bit lines and a fourth output signal to even-numbered ones of said bit lines, said third and fourth output signals being different in voltage level from each other, preselected ones of said word line drive means being coupled to an output of said word line test means such that when the preselected word line drive means are not active, said output signal is applied to said preselected word lines.

5. A semiconductor memory device according to claim 4, wherein said preselected word line drive means are ones connected to odd-numbered word lines.

6. A semiconductor memory device according to claim 4, wherein said preselected word line drive means are ones connected to even-numbered word lines.

7. A semiconductor memory device according to claim 4, wherein said bit line test means comprises switch means for, when said test signal is active, connecting all of said bit line test means to said bit lines.

8. A semiconductor memory device according to claim 1 wherein said word line test means detects short circuits between adjacent word lines by applying voltage across adjacent word lines and detecting current flow through said test means.

9. A semiconductor memory device comprising a plurality of bit lines which are arranged in parallel, said semiconductor memory device further comprises a bit line test means for receiving a test signal, and for, when said test signal is active, applying a first output signal to odd-numbered ones of said bit lines and a second output signal to even-numbered ones of said bit lines, and first and second output signals being different in voltage level from each other wherein said bit line test means detects short circuits between adjacent bit lines by applying a voltage across adjacent bitlines and detecting current flow through said test means.

* * * * *

UNITED STATES PATENT AND TRADEMARK OFFICE
CERTIFICATE OF CORRECTION

PATENT NO. : 5,331,594
DATED : July 19, 1994
INVENTOR(S) : Yasuhiro Hotta

It is certified that error appears in the above-indentified patent and that said Letters Patent is hereby corrected as shown below:

The Title reads:
    SEMICONDUCTOR MEMORY DEVICE HAVING WORD LINE AND BIT LINE TEST CIRCUITS The Title should read:

--SEMICONDUCTOR MEMORY DEVICE HAVING WORD LINE OR BIT LINE TEST CIRCUITS--

Signed and Sealed this

Fourteenth Day of February, 1995

Attest:

BRUCE LEHMAN

Attesting Officer      Commissioner of Patents and Trademarks